United States Patent [19]

Matsumoto et al.

[11] Patent Number: 5,319,804

[45] Date of Patent: Jun. 7, 1994

[54] TRANSMITTER WITH NONLINEARITY CORRECTION CIRCUITS

[75] Inventors: Takayuki Matsumoto, Kadoma; Hiroaki Kosugi, Hirakata, all of Japan

[73] Assignee: Matsushita Electric Industrial Co., Ltd., Tokyo, Japan

[21] Appl. No.: 915,553

[22] Filed: Jul. 20, 1992

[30] Foreign Application Priority Data

Jul. 19, 1991 [JP] Japan .................................. 3-179486

[51] Int. Cl.$^5$ .......................... H04B 1/04; H03G 3/20
[52] U.S. Cl. ...................................... 455/126; 455/89; 455/127; 330/129; 330/279
[58] Field of Search ............... 330/278, 279, 282, 284, 330/285, 287, 129, 130; 455/89, 126, 127, 12, 115, 249.1, 343

[56] References Cited

U.S. PATENT DOCUMENTS

| | | | |
|---|---|---|---|
| 3,486,128 | 12/1969 | Lohrmann | 455/126 |
| 4,560,949 | 12/1985 | Young | 330/279 |
| 4,709,403 | 11/1987 | Kikuchi | 455/126 |
| 4,760,347 | 7/1988 | Li et al. | |
| 4,933,986 | 6/1990 | Leitch | |
| 5,023,937 | 6/1991 | Opas | |
| 5,095,542 | 5/1992 | Suematsu et al. | 455/89 |
| 5,126,688 | 6/1992 | Nakanishi et al. | 330/129 |
| 5,196,806 | 3/1993 | Ichihara | 330/279 |
| 5,208,550 | 5/1993 | Iwane | 455/126 |
| 5,214,393 | 5/1993 | Aihara | 455/126 |

FOREIGN PATENT DOCUMENTS

| | | | |
|---|---|---|---|
| 0261967 | 3/1988 | European Pat. Off. | 330/279 |
| 0369135A2 | 5/1990 | European Pat. Off. | |
| 0446073A1 | 9/1991 | European Pat. Off. | |
| 3505949A1 | 8/1986 | Fed. Rep. of Germany | |
| 2532491 | 3/1984 | France | |
| 0212925 | 8/1989 | Japan | 455/126 |

OTHER PUBLICATIONS

"Digial approach provides precise, programable AGC", Farley, Electronics, Aug. 30, 1971, pp. 51–56.
"Bidirectional Feed Drain Voltage Controlled Amplifier", Chiba et al., NTT Radio Communication Systems Laboratories, pp. 7–12.
"Adaptive Linearisation Using Pre-Distortion", Faulkner et al., IEEE 1990, pp. 35–40.

Primary Examiner—Reinhard J. Eisenzopf
Assistant Examiner—Nguyen Vo
Attorney, Agent, or Firm—Wenderoth, Lind & Ponack

[57] ABSTRACT

In a feedback loop, a modulation carrier signal is amplified or attenuated by a variable gain amplifier (2). A part of a transmission signal amplified by a power amplifier (3) is extracted by a monitor circuit (4), and is detected by an envelope detector (6). This transmission envelope signal and a distortion-free standard envelope signal produced from a standard envelope generator (7) are compared in an error detector (8). An error signal obtained by amplifying the error of the two signals and a DC voltage are added in an adder (9). A gain control terminal (11) of the variable gain amplifier (2) is controlled by using this adder output signal as the control signal. The envelope detector (6) is capable of varying the attenuation quantity of the variable high frequency attenuator (61) and the load resistance value of the variable load circuit (63). Therefore, the dynamic range of the transmission monitor circuit monitor output corresponding to the output voltage of the envelope detector in a predetermined range can be expanded.

17 Claims, 7 Drawing Sheets

TRANSMITTER WITH NONLINEARITY CORRECTION CIRCUITS

BACKGROUND OF THE INVENTION

1. Field of the Invention

The present invention relates to a transmitter of a wireless appliance employing a digital modulation system.

2. Description of the Prior Art

A transmitter employing a digital modulation system has been developed and disclosed in the U.S. patent application Ser. No. 07/777,012. In this appliance, the distortion of a power amplifier is compensated by extracting a part of the transmission signal from the power amplifier, comparing the transmission envelope signal in which the signal is detected of the envelope and a distortion-free envelope signal in an error detector to generate an error signal, and controlling the gain of a gain control amplifier by using this error signal as the gain control signal. This appliance, however, has many aspects to be improved upon. First, generally, a variable gain control amplifier is controlled by a positive DC voltage to some degree. In this appliance, an output voltage of a error amplifier is fixed by the gain of the error amplifier, and a voltage difference between the transmission envelope signal and the distortion-free reference envelope signal. This output voltage of the error amplifier is directly used as a control voltage of the gain control amplifier.

Here, since the gain of the error amplifier should be relatively small in consideration of the stability of the loop circuit, the voltage difference between the transmission envelope signal and the distortion-free reference envelope signal cannot be made too small. A voltage of the variable gain control amplifier (Vg) is obtained as:

$$Vg = (Vcont - vdeta) \times G$$

where $G \times$, Vcont and Vdeta are a gain of the error amplifier, a voltage of the distortion-free reference envelope signal, and a voltage of the transmission envelope signal, respectively. This equation can be transformed as $$Vdeta = Vcont - vg/G,$$

The closer Vdeta is to Vcont, the higher the precision of linearity compensation is. This appliance, however, does not provide a superior precision of lineality because of the restriction of the gain of the error amplifier (G).

Furthermore, when an attempt is made to expand the output power range of the transmission output, the input power range of the envelope detection circuit for detecting the transmission monitor circuit monitor output becomes wide, possibly exceeding the dynamic range of the transmission monitor circuit monitor output power corresponding to the detection voltage in a certain determined range.

SUMMARY OF THE INVENTION

It is hence a primary object of the invention to present a linearity transmission circuit having a broad dynamic range of a transmission monitor output voltage corresponding to a detection voltage in a predetermined range, and capable of compensating the linearity at high precision.

A transmitter of the invention extracts a part of the transmission signal amplified by a power amplifier by a monitor circuit, compares a transmission envelope signal detected by an envelope detection circuit with a distortion-free standard envelope signal using an error detector, adds an error signal and a DC voltage in an adder, and feeds a sum signal to a gain control terminal to control the gain or attenuation of a gain variable circuit. In general, a variable gain control amplifier is controlled by a positive DC voltage to some degree. In this transmitter, the control voltage of the variable gain amplifier is an output voltage of an adder which adds an externally supplied DC voltage supplied from and an output voltage of an error amplifier. As such, the output voltage of the error amplifier can be made lower by a value of the DC voltage. Accordingly, the voltage difference between the transmission envelope signal and the distortion-free standard envelope signal can be settled low. A voltage of the variable gain control amplifier (vg) is obtained as:

$$Vg = G(Vcont - Vdeta) + Vd$$

where $G \times$, Vcont, Vdeta, Vd are a gain of the error amplifier, a voltage of the distortion-free standard envelope signal, a voltage of the transmission envelope signal and an externally supplied, DC voltage respectively. This equation can be transformed as:

$$Vdeta = Vcont - (Vg - Vd)/G$$

The closer Vdeta is to Vcont, the higher the precision of linearity compensation is.

When the output voltage of the error amplifier, G (Vcont−vdeta), is added with the externally supplied DC voltage by the adder, the second term of right hand, (vg−Vd)/G, can be lower by vd/G compared with the case of absence of the DC voltage adder. Accordingly, the difference Vdeta and Vcont can be smaller than in a conventional case. The feedback-loop circuit described above provides an advantage in terms of the linear correction, and distortion-free transmission output will be achieved.

A transmitter in a preferred constitution comprises a gain variable circuit for amplifying or attenuating a modulation carrier signal, and having its gain or attenuation being controlled by a control signal supplied to its gain control terminal, a power amplifier for amplifying an output signal of the gain variable circuit to obtain a transmission signal, a transmission monitor circuit for extracting a part of the transmission signal from the power amplifier as a monitor signal, an envelope detector for detecting an envelope of the monitor signal to obtain a transmission envelope signal, a standard envelope generator for generating a distortion-free standard envelope signal, an error detector for comparing the standard envelope signal and the transmission envelope signal and generating an error signal by amplifying an error of the two signals, and an adder for adding an externally DC voltage and the error signal to generate a control signal, this control signal being fed to the gain control terminal of the gain variable circuit, thereby controlling the gain or attenuation of the gain variable circuit.

More preferably, the detector comprises of a variable high frequency attenuator capable of attenuating a high frequency signal and having its attenuation quantity varied by an external control signal, a diode detector comprising a diode and a capacitor, and a variable load circuit for varying a load resistance value by an external control signal. In this configuration, the dynamic range of the transmission monitor circuit monitor output power corresponding to the detection voltage in a certain predetermined range can be expanded.

BRIEF DESCRIPTION OF THE DRAWINGS

FIG. 2 is an output waveform spectrum characteristic diagram in the transmitter in FIG. 1, in which

DESCRIPTION OF THE PREFERRED EMBODIMENTS

Figure 1:
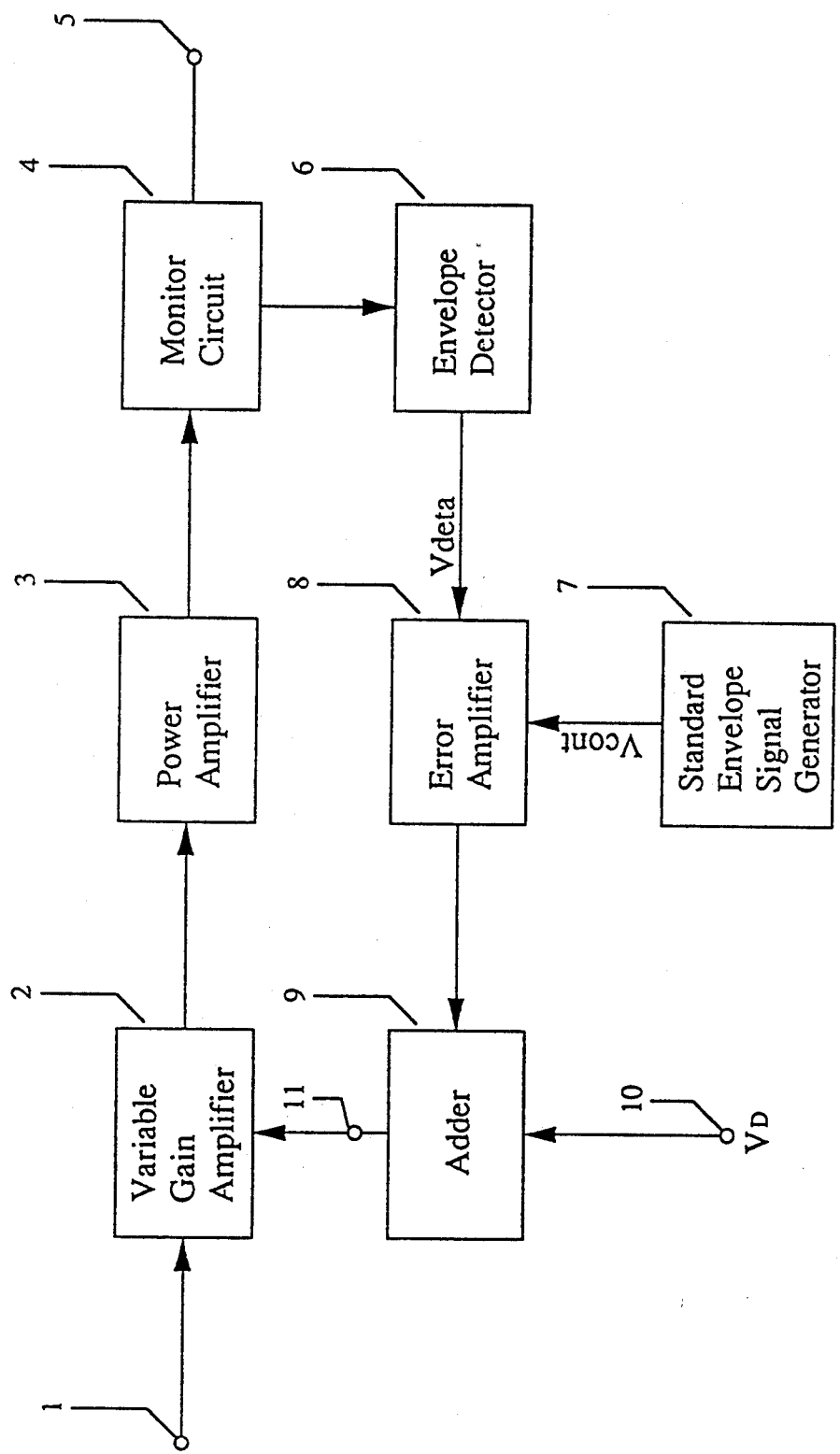
FIG. 1 is a block diagram of a transmitter in an embodiment of the invention.

FIG. 1 shows a block diagram of a transmitter in an embodiment of the invention.

In FIG. 1, numeral 1 is a modulation carrier signal input terminal; 2 is a variable gain amplifier possessing a gain control terminal 11, capable of amplifying or attenuating a modulation carrier signal, and varying the gain or attenuation of this circuit by a control signal supplied to the gain control terminal 11; 3 is a power amplifier for amplifying the output signal of the variable gain amplifier 2 and obtaining a transmission signal; 4 is a monitor circuit for extracting a part of the transmission signal from the power amplifier 3 as a monitor signal; 5 is a transmission signal output terminal; 6 is an envelope detector connected to the transmission monitor circuit 4 for detecting the envelope of the monitor signal and delivering a transmission envelope signal (Vdeta); 7 is a standard envelope signal generator for delivering a standard envelope signal (Vcont); 8 is an error detector connected between the envelope detector 6 and the standard envelope signal generator 7 for comparing the transmission envelope signal (Vdeta) and standard envelope signal (Vcont), and generating an error signal by amplifying the difference (error) between the two signals; and 9 is an adder possessing a DC voltage application terminal 10 for adding an externally supplied DC voltage (VD) and the error signal to generate a control signal, and supplying the control signal to the gain control terminal 11 of the variable gain amplifier 2 so as to control the gain or attenuation of the variable gain amplifier 2.

The operation of the transmitter shown in FIG. 1 is described below.

The modulation carrier signal entered from the modulation carrier signal input terminal 1 is amplified or attenuated by the the variable gain amplifier 2, and further amplified by the power amplifier 3, and a part of the transmission signal is extracting as a monitor signal by the envelope of the monitor circuit 4. The monitor signal is detected by the envelope detector 6, and the transmission envelope signal (Vdeta) is produced. This transmission envelope signal (Vdeta) is fed into the error amplifier 8 together with the standard envelope signal (Vcont) generated in the standard envelope signal generator 7. The error voltage of the transmission envelope signal (Vdeta) and the standard envelope signal (Vcont) is detected and amplified by the error amplifier 8 to be produced as an error signal. In consequence, the error signal voltage and DC voltage (VD) applied from the DC voltage application terminal 10 are summed in the adder 9, and a control signal is produced, which controls the gain or attenuation of the variable gain amplifier 2. By composing a feedback loop in this way, the transmission output is controlled by the standard envelope signal.

Figure 2A:
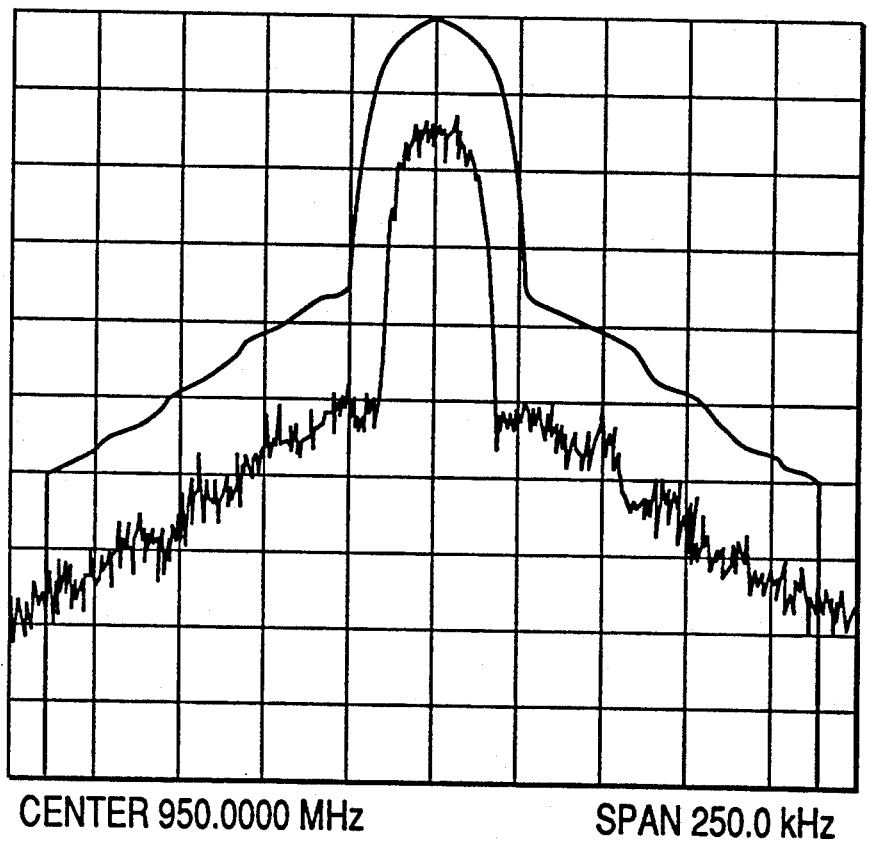
FIG. 2(a) is an output waveform spectrum characteristic diagram obtained by applying 0 (V) to a DC voltage application terminal 10 in FIG. 1, and FIG. 2 (b) is an output waveform spectrum characteristic diagram obtained by applying 1.5 (V) to the DC voltage application terminal 10.
Figure 2B:
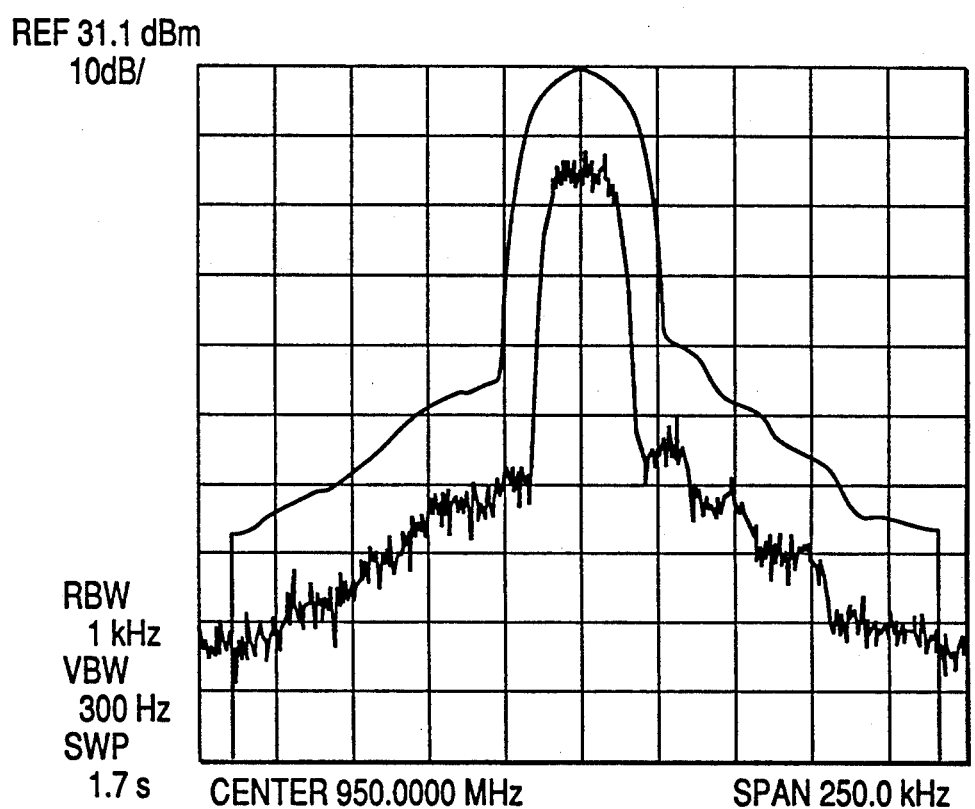

FIGS. 2 (a) and 2 (b) show transmission output waveform spectrum characteristic diagrams when the distortion of the power amplifier is compensated by the feedback loop shown in FIG. 1. More specifically, FIG. 2 (a) shows the spectrum characteristic when a DC voltage (VD) of 0 (V) is applied to the DC voltage application terminal 10, and FIG. 2 (b) shows the spectrum characteristic when a DC voltage (VD) of 1.5 (V) is applied to the DC voltage application terminal 10. It is apparent from FIGS. 2 (a) and 2 (b) that the precision of linearity compensation for compensating for distortion of the power amplifier is improved and the adjacent channel interference characteristic is improved when the DC voltage (VD=1.5 V) is applied from the DC voltage application terminal 10.

Figure 3:
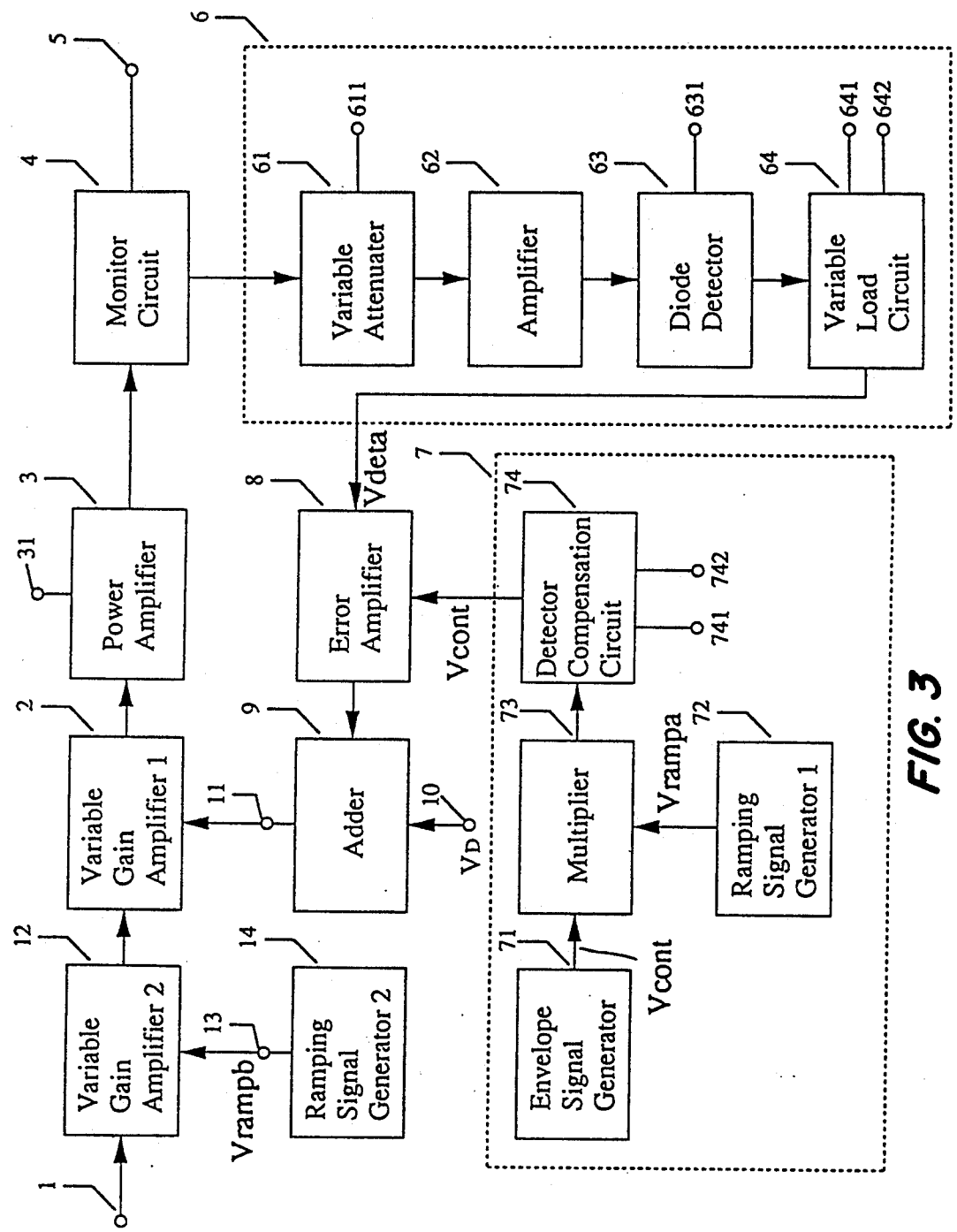
FIG. 3 is a block diagram of a transmitter in another embodiment of the invention.
Figure 4:
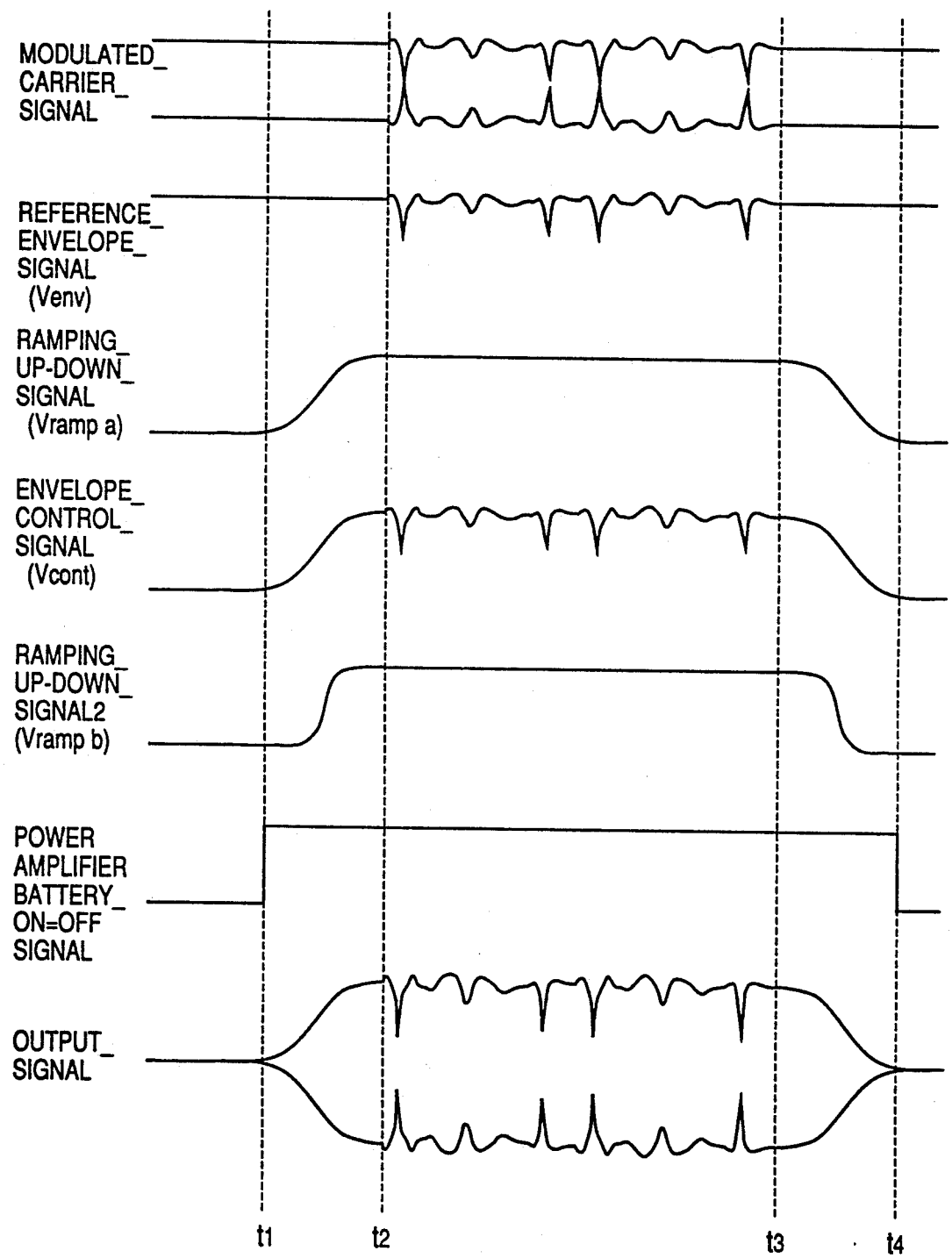
FIG. 4 is a timing chart of the transmitter in FIG. 3.

FIG. 3 and FIG. 4 show a block diagram and a timing chart of a transmitter in another embodiment of the invention, respectively.

In FIG. 3, numeral 1 is a modulation carrier signal input terminal; 12 is a second variable gain amplifier possessing a gain control terminal 13 capable of amplifying or attenuating the modulation carrier signal, and varying the gain or attenuation of this circuit by a control signal entered in the gain control terminal 13; 2 is a first variable gain amplifier possessing a gain control terminal 11 capable of amplifying or attenuating the output signal of the second variable gain amplifier 12, and varying the gain or attenuation of this circuit by a control signal entered in the gain control terminal 11; 3 is a power amplifier possessing a supply voltage control terminal 31 for receiving the output signal of the first variable gain amplifier 2, and amplifying this input signal to obtain a transmission signal; 4 is a transmission monitor circuit for extracting a part of the transmission signal from the power amplifier as a monitor signal; 5 is a transmission signal output terminal; 6 is an envelope detector connected to the transmission monitor circuit 4 for detecting the envelope of the monitor signal and producing a transmission envelope signal (Vdeta); 7 is a standard envelope generator for producing a standard envelope signal (Vcont); 8 is an error amplifier connected between the envelope detector 6 and the standard envelope generator 7 for comparing the transmission envelope signal (Vdeta) and standard envelope signal (Vcont), and generating an error signal by amplifying the the difference (error) between the two signals; 9 is an adder possessing a DC voltage application terminal 10 for adding an externally supplied DC voltage (VD) supplied from outside and the error signal voltage to generate a control signal, feeding the control signal to the gain control terminal 11 of the first variable gain amplifier 2 so as to control the gain or attenuation of the first variable gain amplifier 2; and 14 is a second ramping signal generator for generating a ramping up-down signal (Vrampb) for burst control of the gain or attenuation of the second variable gain amplifier 12. The envelope detector 6 is composed of a variable attenuator 61 possessing a variable high frequency attenuator control terminal 611, capable of attenuating the high frequency signal, and varying the attenuation quantity by applying an external control signal to the high frequency attenuator control terminal 611, a high frequency amplifier 62 capable of amplifying a high frequency signal, a diode detector 63 composed of a diode and capacitor, and possessing a diode bias terminal 631 for applying a bias voltage to the diode, and a variable load circuit 64 possessing variable load circuit control terminals 641, 642, capable of varying the load resistance value by applying an external control signal to these terminals. The standard envelope generator 7 is composed of a distortion-free envelope signal generator 71 for generating a distortion-free envelope signal (Venv), a first ramping signal generator 72 for generating a ramping up-down signal (Vrampa) for burst control of the distortion-free envelope signal, a multiplier 73 for multiplying the distortion-free envelope signal and burst control signal, and a detector compensation circuit 74 possessing resistance load control terminals 741, 742, for receiving the multiplier output signal, compensating the nonlinearity of the detector, and producing the detection characteristic compensation envelope signal, and the output of the detector compensation circuit 74 is delivered as the standard envelope signal (Vcont). The operation of this transmitter shown in FIG. 3 is explained below with reference to the timing chart in FIG. 4.

In FIG. 4, the time t1–t2 is the transmission signal rise time, the time t2–t3 is the modulation data transmission time, and the time t3–t4 is the transmission signal fall time.

First, the operation before time t1 is explained. In this period, the ramping up-down signal 1 (Vrampa), ramping up-down signal 2 (Vrampb), and power amplifier battery on/off signal are all 0 (V). In the multiplier 73, (Venv) and (Vrampa=0 V) are multiplied, and its output is 0 (V) In the power amplifier 3, since the power source is cut off, the output of the transmission signal is suppressed.

In the period of t1–t2, since the power amplifier battery on-off signal is ON, the power amplifier is turned on. The first variable gain amplifier 2, power amplifier 3, monitor circuit 4, envelope detector 6, error amplifier 8, and adder 9 compose a feedback loop, and the transmission signal is controlled by the output (Vcont) of the standard envelope generator. In this period, (Vrampa) rises smoothly, and the output of the multiplier 73 also rises smoothly, and (Vcont) which is the output of the detector compensation circuit 74 also rises smoothly. At the same time, (Vrampb) also rises smoothly, so that the transmission signal rises smoothly.

In the period of t2–t3, the modulation carrier signal is a modulated signal, and the standard envelope generator 7 produces a distortion-free standard envelope signal compensating the characteristic of the envelope detector 6. The feedback loop is controlled by this distortion-free standard envelope signal, and a distortion-free transmission signal is generated consequently. Since the envelope detector 6 is composed of the variable high frequency attenuator 61 for varying the attenuation quantity by an external control signal, the high frequency amplifier 62 for amplifying the high frequency signal, diode detector 63, and variable load circuit 64 for varying the load resistance value by an external control signal, using the control voltage applied to the variable high frequency attenuator control terminal 611, and variable load circuit control terminals 641, 642, by varying the attenuation quantity of the variable high frequency attenuator 61 and load value of variable load circuit, if the transmission signal output is varied and the transmission monitor circuit monitor output voltage changes to a certain degree, the detection voltage in a certain specific range can be delivered. By applying a voltage to the diode bias terminal 631 and applying a bias voltage to the diode of the diode detector 63, the linearity of the input and output characteristic of the diode detector 63 can be enhanced, and the effect of the linearity compensation for compensating the distortion of the power amplifier 3 may be improved.

In the period of the t3–t4, by the reverse operation of t1–t2 period, the transmission signal falls smoothly.

Figure 5:
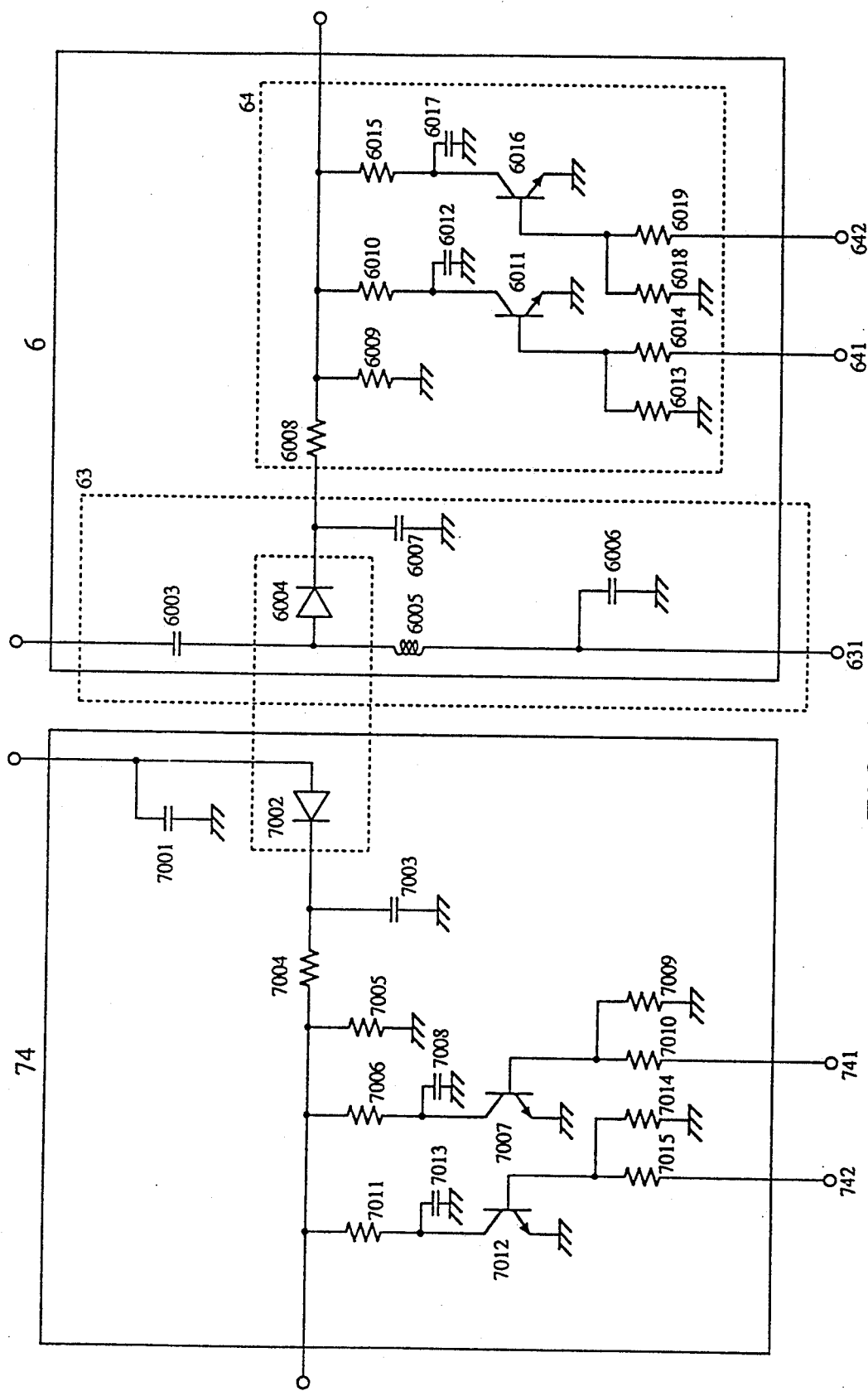
FIG. 5 is a constitution example of a diode detector and a variable load circuit in an envelope detector, and a detection characteristic compensator of the invention.
Figure 6:
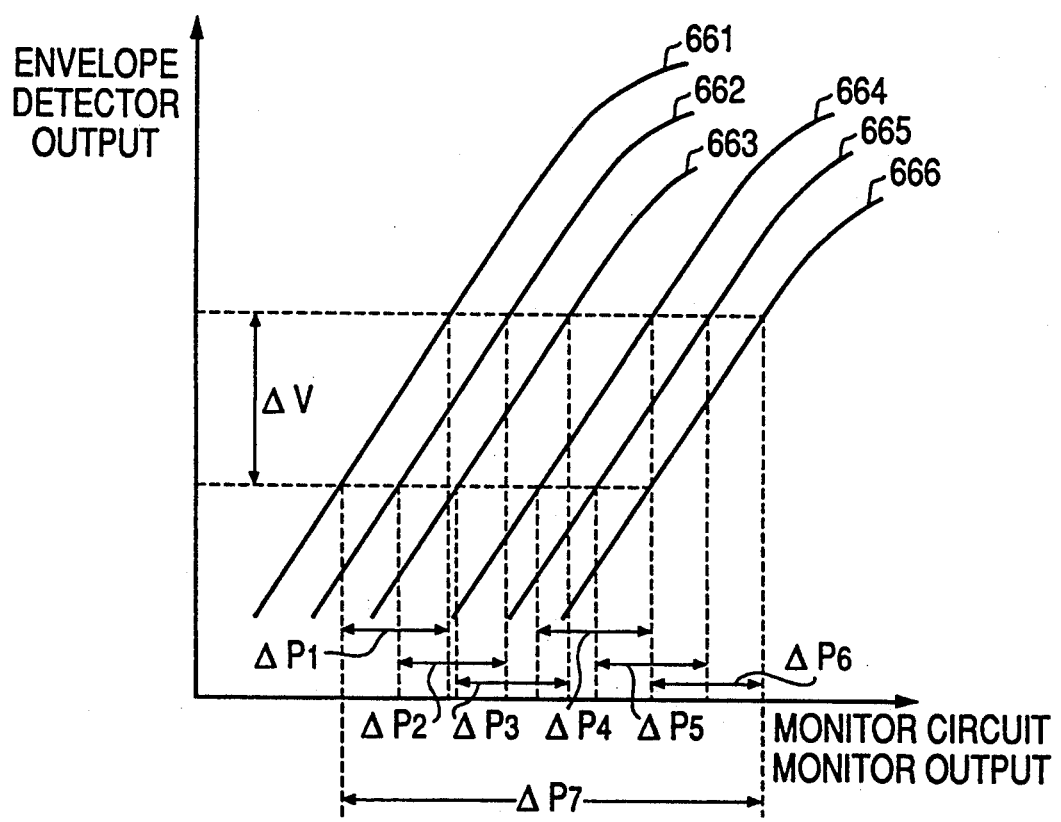
FIG. 6 is a diagram showing the input and output characteristics of the envelope detector comprising a variable high frequency attenuator capable of attenuating a high frequency signal and varying the attenuation quantity by an external control signal, a diode detector possessing a diode bias terminal, and a variable load circuit capable of varying the load resistance value by an external control signal, in which the axis of abscissas denotes the transmission monitor circuit monitor output which is the input of the envelope detector, and the axis of ordinates represents the output of the envelope detect

FIG. 5 shows a structural example of diode detector 63 and variable load circuit in the envelope detector 6, and the detector compensation circuit 74, and FIG. 6 shows the input and output characteristic of the envelope detector.

In FIG. 5, numeral 63 is a diode detector, 64 is a variable load circuit, 6004 is a detector diode, 6003 is a capacitor for bypassing the modulation carrier signal, 6005 is a bias coil, 6006, 6007, 6012, 6017 are high frequency grounding capacitors, 6008, 6009, 6010, 6013, 6014, 6015, 6018, 6019, 7004, 7005, 7006, 7009, 7010, 7011, 7014, 7015 are fixed resistors, 6011, 6016, 7007, 7012 are transistors for variable load resistance on/off control, 631 is a diode detector bias input terminal, 641 642 are variable load circuit control terminals, 7002 is a detector characteristic compensating diode, 7001, 7003, 7008, 7013 are DC voltage stabilizing capacitors, and 741, 742 ar e load control terminals.

The diode 7002 of the detector compensation circuit 74 is the same as the detector diode 6004 used in the diode detector 63 of the envelope detector 6, and diodes matched in characteristic for both are used. When a modulation carrier signal is entered in the diode detector 63, this signal is detected, and a detection current proportional to the electric power of the input modulation carrier signal is generated. When the transistors 6011, 6016 are in a non-conductive state, the detection current generates a detection voltage according to the current flowing into the variable resistance load circuit 64 and the resistance of the fixed resistors 6008, 6009. By passing a current into the variable resistor control terminal 641, the transistor 6011 is set in a conductive state. By not passing a current into the variable resistor control terminal 642, the transistor 6016 is set in the non-conductive state, a detection voltage depending on the current flowing into the variable resistance load circuit 64 and the resistances of the fixed resistors 6008, 6009, 6010 is generated. Similarly, by passing a current into the variable resistor control terminal 642 to conduct the transistor 6016, and by not passing a current into the variable resistor control terminal 641 to set the transistor 6011 in a non-conductive state, a detection voltage conforming to the current flowing into the variable resistor load circuit 64 and the resistance of fixed resistors 6008, 6009, 6015 is generated. Further, when the transistors 6011, 6016 are set in conductive state by passing a current into the variable resistor control terminals 641, 642, a detection voltage conforming to the current flowing into the variable resistor load circuit 64 and the resistance of the fixed resistors 6008, 6009, 6010, 6015 is generated. That is, by turning on or off transistors 6011, 6016, the fixed resistance in the variable resistor load 64 is selected, and the detection voltage output may be varied freely, and therefore if the detector input voltage varies, the detection voltage is suppressed so as not to change by a large amount. Meanwhile, the diode detector 63 has a diode bias terminal 631, and by applying an external bias voltage to the diode bias-terminal 631, a bias current flows into the detector diode 6004 of the diode detector 63. By passing this bias current, if the high frequency electric power fed in the diode detector is small, a large detection voltage can be generated. In the detector, compensation circuit, using the voltage applied to the resistance load control terminals 741, 742, by turning on and off the transistors 7007, 7012, the output voltage of the detector compensation circuit may be freely varied. After a distortion-free envelope signal passes through the detector characteristic compensation circuit 74, the same nonlinearity as in the detector diode 6004 is applied, and the standard envelope signal (Vcont) which is the output of the detector characteristic compensation circuit and the transmission envelope signal (Vdeta) which is the output of the envelope detector 6 are fed into the error detector 8, in which the mutual nonlinearities are canceled. By composing the detector diode 6004 and diode 7002 by using the same semiconductor chip, the characteristics of the two, may be matched, and they act also to cancel each other against changes of the characteristics due to temperature.

In FIG. 6, the axis of abscissas denotes the output of the transmission monitor circuit, and the axis of ordinates represents the detection voltage delivered to the envelope detector, and numeral 661, 662, 663 are characteristics of the envelope detector, showing the large, medium and small resistance values of the variable load resistance when the attenuation quantity of the variable high frequency attenuator is small, and 664, 665, 666 refer to the case when the attenuation quantity of the variable high frequency attenuator is large, showing large, medium and small resistances of the variable load resistance. As is apparent from FIG. 6, in the case where the attenuation quantity of the variable high frequency attenuator is small for a specific detection voltage ΔV, if the resistance of the variable load circuit is large, the transmission monitor output is ΔP1, if the resistance of the resistance load is medium, the transmission monitor output is ΔP2, and if the resistance of the resistance load is small, the transmission monitor output is ΔP3, and in the case where the attenuation quantity of the variable high frequency attenuator is large, if the resistance of the variable load circuit is large, the transmission monitor output is ΔP4, if the resistance of the resistance load is medium, the transmission monitor output is ΔP5, and if the resistance of the resistance load is small, the transmission monitor output is ΔP6, and therefore as the comprehensive detection characteristic, it is known that the transmission monitor output range ΔP7 is extended. Further, by applying a bias voltage to the detector diode, the individual output voltages are found to maintain the linearity if the transmission monitor output is small.

What is claimed is:

1. A transmitter comprising:
   a gain variable circuit for amplifying or attenuating a modulation carrier signal and having a gain control terminal, a gain or attenuation of the gain variable circuit being controlled by a gain control signal fed to the gain control terminal;
   a power amplifier for amplifying an output signal of the gain variable circuit to obtain a transmission signal;
   a transmission monitor circuit for extracting a part of the transmission signal from the power amplifier as a monitor signal;
   an envelope detector for detecting an envelope of the monitor signal and generating a transmission envelope signal corresponding to the envelope of the transmission signal;
   a standard envelope signal generator for generating a distortion-free standard envelope signal;
   an error detector for comparing the transmission envelope signal and the standard envelope signal to obtain an error therebetween and generating an error signal corresponding to the error; and
   an adder for adding an externally supplied predetermined DC voltage supplied from outside and the error signal to generate the gain control signal, the gain control signal being fed to the gain control terminal of the gain variable circuit-to-control the gain or attenuation of the gain variable circuit,
   wherein the envelope detector comprises a diode detector comprising a diode and a first capacitor for detecting the envelope of the monitor signal, and a variable load circuit for varying a level of the envelope of the monitor signal to obtain the transmission envelope signal, wherein the variable load circuit includes a load resistor having a first end connected to an output terminal of the variable load circuit and a second end connected via a second capacitor to a ground, a transistor having a collector terminal connected to the second end of the load resistor, an emitter terminal connected to the ground and a base terminal connected to a load control terminal, and wherein the transistor is responsive to an externally supplied load control signal and fed to the load control terminal for controlling a current flowing through the load resistor to thereby generate a level controlled envelope signal as the transmission envelope signal at the output terminal of the variable load circuit.

2. A transmitter comprising:
   a first gain variable circuit for amplifying or attenuating a modulation carrier signal and having a first gain control terminal, a gain or attenuation of the first gain variable circuit being controlled by a signal fed to the first gain control terminal;
   a second gain variable circuit connected to the first gain variable circuit for amplifying or attenuating an output signal of the first gain variable circuit and having a second gain control terminal, a gain or attenuation of the second gain variable circuit being controlled by a signal fed to the second gain control terminal;

a burst control signal generator for generating a burst control signal which is fed to one of the first and second gain control terminals for burst control of the gain or attenuation of one of the first and second gain variable circuits which has said one of the first and second gain control terminals;

a power amplifier for amplifying an output signal of the second gain variable circuit to obtain a transmission signal;

a transmission monitor circuit for extracting apart of the transmission signal from the power amplifier as a monitor signal;

an envelope detector for detecting an envelope of the monitor signal and generating a transmission envelope signal corresponding to the envelope of the transmission signal;

a standard envelope generator for generating a distortion-free standard envelope signal;

an error detector for comparing the transmission envelope signal and the standard envelope signal to obtain an error therebetween and generating an error signal corresponding to the error; and an adder for adding an externally supplied predetermined DC voltage and the error signal to generate a gain control signal, the gain control signal being fed to the other of the first and second gain control terminals to control the gain or attenuation of the other of the first and second gain variable circuits which has said the other of the first and second gain control terminals, wherein the envelope detector comprises a diode detector comprising a diode and a first capacitor for detecting the envelope of the monitor signal, and a variable load circuit for varying a level of the envelope of the monitor signal to obtain the transmission envelope signal, wherein the variable load circuit includes a load resistor having a first end connected to an output terminal of the variable load circuit and a second end connected via a second capacitor to a round, a transistor having a collector terminal connected to the second end of the load resistor, an emitter terminal connected to the ground and a base terminal connected to a load control terminal, and wherein the transistor is responsive to an externally supplied load control signal and fed to the load control terminal for controlling a current flowing through the load resistor to thereby generate a level controlled envelope signal as the transmission envelope signal at the output terminal of the variable load circuit.

3. A transmitter comprising:

a first gain variable circuit for amplifying or attenuating a modulation carrier signal and having a first gain control terminal, a gain or attenuation of the first gain variable circuit being controlled by a signal fed to the first gain control terminal;

a second gain variable circuit connected to the first gain variable circuit for amplifying or attenuating an output signal of the first gain variable circuit and having a second gain control terminal, a gain or attenuation of the second gain variable circuit being controlled by a signal fed to the second gain control terminal;

a burst control signal generator for generating a burst control signal which is fed to the first gain control terminal for burst control of the gain or attenuation of the first gain variable circuit;

a power amplifier for amplifying an output signal of the second gain variable circuit to obtain a transmission signal;

a transmission monitor circuit for extracting a part of the transmission signal from the power amplifier as a monitor signal;

an envelope detector for detecting an envelope of the monitor signal and generating a transmission envelope signal corresponding to the envelope of the transmission signal;

a standard envelope generator for generating a distortion-free standard envelope signal;

an error detector for comparing the transmission envelope signal and the standard envelope signal to obtain an error therebetween and generating an error signal corresponding to the error; and an adder for adding an externally supplied predetermined DC voltage and the error signal to generate a gain control signal, the gain control signal being fed to the second gain control terminal to control the gain or attenuation of the second gain variable circuit, wherein the envelope detector comprises a diode detector comprising a diode and a first capacitor for detecting the envelope of the monitor signal, and a variable load circuit for varying a level of the envelope of the monitor signal to obtain the transmission envelope signal, wherein the variable load circuit includes a load resistor having a first end connected to an output terminal of the variable load circuit and a second end connected via a second capacitor to a ground, a transistor having a collector terminal connected to the second end of the load resistor, an emitter terminal connected to the ground and a base terminal connected to a load control terminal, and wherein the transistor is responsive to an externally supplied load control signal and fed to the load control terminal for controlling a current flowing through the load resistor to thereby generate a level controlled envelope signal as the transmission envelope signal at the output terminal of the variable load circuit.

4. A transmitter of claim 1, wherein the diode detector has a diode bias terminal so that a bias current is passed to the diode by an external bias voltage applied to the diode bias terminal.

5. A transmitter of claim 1, wherein the envelope detector further comprises a variable high frequency attenuator for attenuating a high frequency signal contained in the monitor signal and varying an attenuation quantity by an external attenuator control signal, an output signal of the variable high frequency attenuator being fed to the diode detector.

6. A transmitter of claim 1, wherein the envelope detector further comprises a variable high frequency attenuator for attenuating a high frequency signal contained in the monitor signal and varying an attenuation quantity by an external attenuator control signal, and a high frequency amplifier for amplifying the attenuated high frequency signal, an output signal of the high frequency amplifier being fed to the diode detector.

7. A transmitter of claim 1, wherein the standard envelope generator comprises a distortion-free envelope generator for generating a distortion-free envelope signal, and a detector characteristic compensation circuit having a diode which has a nonlinear characteristic identical to that of the diode of the diode detector and passing therethrough the distortion-free envelope signal to produce the distortion-free standard envelope signal which has the same nonlinearity as that of the transmission envelope signal so that the nonlinearities of the transmission envelope signal and the standard envelope signal are canceled by each other at the error detector.

8. A transmitter of claim 2, wherein the diode detector has a diode bias terminal so that a bias current is passed to the diode by an external bias voltage applied to the diode bias terminal.

9. A transmitter of claim 2, wherein the envelope detector further comprises a variable high frequency attenuator for attenuating a high frequency signal contained in the monitor signal and varying its attenuation quantity by an external attenuator control signal, an output signal of the variable high frequency attenuator being fed to the diode detector.

10. A transmitter of claim 2, wherein the envelope detector further comprises a variable high frequency attenuator for attenuating a high frequency signal contained in the monitor signal and varying its attenuation quantity by an external attenuator control signal, and a high frequency amplifier for amplifying the attenuated high frequency signal, an output signal of the high frequency amplifier being fed to the diode detector.

11. A transmitter of claim 2, wherein the power amplifier controls a switching of a supply voltage by a transmission on/of signal corresponding to a transmission burst signal output.

12. A transmitter of claim 2, wherein the standard envelope generator comprises an envelope generator for generating a distortion-free envelope signal, a second burst control signal generator for generating a second burst control signal for controlling the distortion-free envelope signal, a multiplier for multiplying the distortion-free envelope signal and the second burst control signal, and a detector characteristic compensation circuit having a diode which has a nonlinear characteristic identical to that of the diode of the diode detector and passing therethrough an output signal of the multiplier to produce the distortion-free standard envelope signal which has the same nonlinearity as that of the transmission envelope signal so that the nonlinearities of the transmission envelope signal and the standard envelope signal are canceled by each other at the error detector.

13. A transmitter of claim 3, wherein the diode detector has a diode bias terminal so that a bias current is passed to the diode by an external bias voltage applied to the diode bias terminal.

14. A transmitter of claim 3, wherein the envelope detector further comprises a variable high frequency attenuator for attenuating a high frequency signal contained in the monitor signal and varying its attenuation quantity by an external attenuator control signal, an output signal of the variable high frequency attenuator being fed to the diode detector.

15. A transmitter of claim 3, wherein the envelope detector further comprises a variable high frequency attenuator for attenuating a high frequency signal contained in the monitor signal and varying its attenuation quantity by an external attenuator control signal, and a high frequency amplifier for amplifying the attenuated high frequency signal, an output signal of the high frequency amplifier being fed to the diode detector.

16. A transmitter of claim 3, wherein the power amplifier controls a switching of a supply voltage by a transmission on/off signal corresponding to a transmission burst signal output.

17. A transmitter of claim 3, wherein the standard envelope generator comprises an envelope generator for generating a distortion-free envelope signal, a second burst control signal generator for generating a second burst control signal for controlling the distortion-free envelope signal, a multiplier for multiplying the distortion-free envelope signal and the second burst control signal, and a detector characteristic compensation circuit having a diode which has a nonlinear characteristic identical to that of the diode of the diode detector and passing therethrough an output signal of the multiplier to produce the distortion-free standard envelope signal which has the same nonlinearity as that of the transmission envelope signal so that the nonlinearities of the transmission envelope signal and the standard envelope signal are canceled by each other at the error detector.

* * * * *